(12) United States Patent
Talledo et al.

(10) Patent No.: US 11,004,776 B2
(45) Date of Patent: May 11, 2021

(54) SEMICONDUCTOR DEVICE WITH FRAME HAVING ARMS AND RELATED METHODS

(71) Applicant: STMicroelectronics, Inc., Calamba City (PH)

(72) Inventors: Jefferson Talledo, Calamba (PH); Rammil Seguido, Malolos (PH)

(73) Assignee: STMICROELECTRONICS, INC., Calamba City (PH)

( * ) Notice: Subject to any disclaimer, the term of this patent is extended or adjusted under 35 U.S.C. 154(b) by 0 days.

(21) Appl. No.: 15/912,193

(22) Filed: Mar. 5, 2018

(65) Prior Publication Data
US 2018/0197809 A1 Jul. 12, 2018

Related U.S. Application Data

(62) Division of application No. 14/957,785, filed on Dec. 3, 2015, now Pat. No. 9,947,612.

(51) Int. Cl.
*H01L 23/495* (2006.01)
*H01L 23/48* (2006.01)
(Continued)

(52) U.S. Cl.
CPC ...... *H01L 23/49531* (2013.01); *H01L 21/563* (2013.01); *H01L 23/49503* (2013.01); *H01L 23/49541* (2013.01); *H01L 23/49548* (2013.01); *H01L 23/49568* (2013.01); *H01L 23/49575* (2013.01); *H01L 23/49861* (2013.01); *H01L 24/49* (2013.01); *H01L 24/73* (2013.01); *H01L 24/85* (2013.01); *H01L 24/97* (2013.01); *H01L 21/561* (2013.01); *H01L 23/3107* (2013.01); *H01L 24/05* (2013.01); *H01L 24/32* (2013.01); *H01L 24/45* (2013.01); *H01L 24/48* (2013.01); *H01L 2224/05624* (2013.01); *H01L 2224/05647* (2013.01); *H01L 2224/45124* (2013.01); *H01L 2224/45139* (2013.01); *H01L 2224/45144* (2013.01); *H01L 2224/45147* (2013.01);
(Continued)

(58) Field of Classification Search
CPC ............. H01L 21/563; H01L 23/49503; H01L 23/49541; H01L 23/49548; H01L 23/49568; H01L 23/49575; H01L 23/49861; H01L 24/49; H01L 24/85; H01L 24/97
USPC ................ 257/676, 620, 680, 784, 786, 787
See application file for complete search history.

(56) References Cited

U.S. PATENT DOCUMENTS 5,583,377 A * 12/1996 Higgins, III ............ H01L 23/13
257/706
6,271,581 B2 * 8/2001 Huang ................ H01L 23/4334
257/666
(Continued)

FOREIGN PATENT DOCUMENTS

WO 9820718 A1 5/1998

*Primary Examiner* — Kimberly N Rizkallah
*Assistant Examiner* — Dilinh P Nguyen
(74) *Attorney, Agent, or Firm* — Slater Matsil, LLP

(57) ABSTRACT

A semiconductor device may include a circuit board having an opening, and a frame. The frame may have an IC die pad in the opening, and arms extending outwardly from the IC die pad and coupled to the circuit board. The semiconductor device may include an IC mounted on the IC die pad, bond wires coupling the circuit board with the IC, and encapsulation material surrounding the IC, the bond wires, and the arms.

19 Claims, 4 Drawing Sheets

(51) Int. Cl.
*H01L 23/52* (2006.01)
*H01L 23/00* (2006.01)
*H01L 21/56* (2006.01)
*H01L 23/498* (2006.01)
*H01L 23/31* (2006.01)

(52) U.S. Cl.
CPC .............. *H01L 2224/48091* (2013.01); *H01L 2224/48227* (2013.01); *H01L 2224/48247* (2013.01); *H01L 2224/4918* (2013.01); *H01L 2224/73265* (2013.01); *H01L 2224/83424* (2013.01); *H01L 2224/83447* (2013.01); *H01L 2224/92247* (2013.01); *H01L 2224/97* (2013.01); *H01L 2924/10253* (2013.01); *H01L 2924/14* (2013.01); *H01L 2924/181* (2013.01); *H01L 2924/3511* (2013.01)

(56) References Cited

U.S. PATENT DOCUMENTS

| | | | |
|---|---|---|---|
| 6,396,133 B1 | 5/2002 | James | |
| 6,400,569 B1 | 6/2002 | Auer | |
| 6,906,414 B2 * | 6/2005 | Zhao | H01L 23/13 257/706 |
| 7,202,559 B2 | 4/2007 | Zhao et al. | |
| 7,919,788 B2 | 4/2011 | Wu et al. | |
| 7,932,586 B2 | 4/2011 | Chen et al. | |
| 8,017,503 B2 * | 9/2011 | Oi | H01L 24/97 257/620 |
| 8,736,046 B2 | 5/2014 | Seah | |
| 9,425,139 B2 * | 8/2016 | Liu | H01L 24/32 |
| 2007/0018291 A1 * | 1/2007 | Huang | H01L 21/4821 257/676 |
| 2008/0197464 A1 * | 8/2008 | Dirks | H01L 23/3107 257/676 |
| 2012/0018498 A1 | 1/2012 | Zhong et al. | |
| 2012/0126399 A1 * | 5/2012 | Lin | H01L 21/56 257/737 |
| 2014/0251658 A1 | 9/2014 | Lin et al. | |
| 2016/0027694 A1 * | 1/2016 | Truhitte | H01L 21/6835 438/107 |

\* cited by examiner

SEMICONDUCTOR DEVICE WITH FRAME HAVING ARMS AND RELATED METHODS

CROSS-REFERENCE TO RELATED APPLICATIONS

This application is a divisional of U.S. patent application Ser. No. 14/957,785, filed on Dec. 3, 2015, which application is hereby incorporated herein by reference.

TECHNICAL FIELD

The present disclosure relates to the field of electronic device manufacturing, and, more particularly, to a method for making integrated circuit devices.

BACKGROUND

In electronic devices with integrated circuits (ICs), the ICs are typically mounted onto circuit boards. In order to electrically couple connections between the circuit board and the IC, the IC is typically "packaged." The IC packaging usually provides a small encasement for physically protecting the IC and provides contact pads for coupling to the circuit board. In some applications, the packaged IC may be coupled to the circuit board via solder bumps.

One approach to IC packaging comprises a quad-flat no-leads (QFN) package. The QFN package may provide some advantages, such as reduced lead inductance, a near chip scale footprint, thin profile, and low weight. Also, the QFN package typically includes perimeter I/O pads to ease circuit board trace routing, and the exposed copper die-pad technology offers enhanced thermal and electrical performance. QFN packaging may be well suited for applications where size, weight, and thermal and electrical performance are important.

In particular, since the coefficients of thermal expansion (CTEs) for certain materials in the packaging process mismatch, there can be some defects in the final IC device. For example, the CTE mismatch can cause breaks and discontinuities in the final IC devices. Also, the carrier strip or substrate can warp, i.e. creating wafer bow.

SUMMARY

Generally speaking, a semiconductor device may include a circuit board having an opening therein, and a frame (e.g. a metallic material frame) comprising an IC die pad in the opening, and a plurality of arms extending outwardly from the IC die pad and coupled to the circuit board. The semiconductor device may also include at least one IC mounted on the IC die pad, a plurality of bond wires coupling the circuit board with the at least one IC, and encapsulation material surrounding the at least one IC, the plurality of bond wires, and the plurality of arms. Advantageously, the semiconductor device may effectively radiate thermal energy.

In some embodiments, the IC die pad may have first and second opposing surfaces, the first opposing surface being adjacent the at least one IC, the second opposing surface being exposed through the opening of the circuit board. The IC die pad may be rectangle-shaped, and each arm may extend diagonally outward from a respective corner of the rectangle-shaped IC die pad.

Also, the IC die pad and the circuit board may have adjacent aligned bottom surfaces. The circuit board may include a dielectric layer, and a plurality of electrically conductive traces carried by the dielectric layer and respectively coupled to the plurality of bond wires. The at least one IC may comprise a substrate, and a plurality of bond pads carried by the substrate and respectively coupled to the plurality of bond wires.

Additionally, the semiconductor device may include an adhesive layer between respective distal ends of the plurality of arms and the circuit board. The semiconductor device may comprise an adhesive layer between the at least one IC and the IC die pad. The encapsulation material may surround peripheral edges of the circuit board and the frame.

Another aspect is directed to a method for making a semiconductor device. The method may include forming a circuit board having an opening therein, and positioning a frame. The frame may comprise an IC die pad in the opening, and a plurality of arms extending outwardly from the IC die pad and coupled to the circuit board. The method may comprise positioning at least one IC on the IC die pad, and forming a plurality of bond wires coupling the circuit board with the at least one IC. The method may also include forming encapsulation material surrounding the at least one IC, the plurality of bond wires, and the plurality of arms.

DETAILED DESCRIPTION OF ILLUSTRATIVE EMBODIMENTS

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout.

Figure 1:
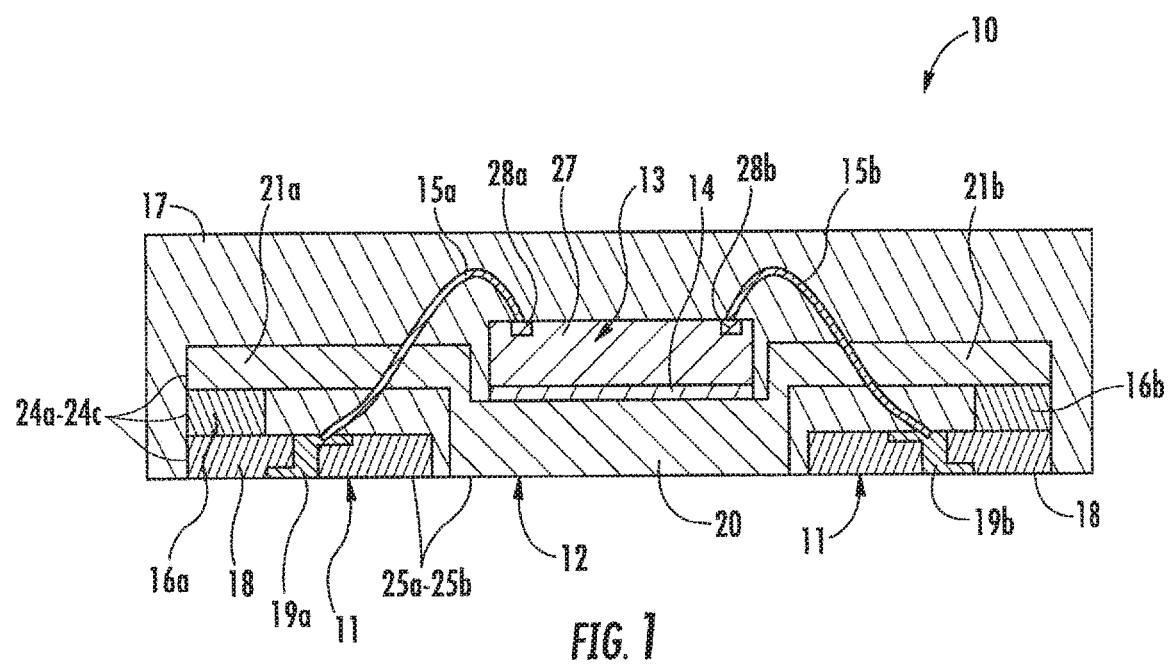
FIG. 1 is a schematic side view of a semiconductor device, according to the present disclosure.

Referring now initially to FIG. 1, a semiconductor device 10 according to the present disclosure is now described. The semiconductor device 10 includes a circuit board 11 having an opening 26 (FIGS. 2A-2C) therein. The opening 26 is illustratively rectangle-shaped and medially placed, but may have an offset in other embodiments. Also, the opening 26 may have other shapes (e.g. shapes with rounded edges) in other embodiments. The circuit board 11 illustratively includes a dielectric layer 18, and a plurality of electrically conductive traces 19*a*-19*b* carried by the dielectric layer. The plurality of electrically conductive traces 19*a*-19*b* may define a plurality of contact pads for coupling to external circuitry. The plurality of electrically conductive traces 19*a*-19*b* may comprise, for example, one or more of copper and aluminum. The dielectric layer 18 may comprise, for example, an organic laminate material, or a liquid crystal polymer.

The semiconductor device 10 includes a frame 12 comprising an IC die pad 20 in the opening 26, and a plurality of arms 21*a*-21*b* extending outwardly from the IC die pad and coupled to the circuit board 11. In the illustrated embodiment, the IC die pad 20 is downset with respect to the plurality of arms 21a-21b. In some embodiments, the frame 12 may comprise a metallic material, such as one or more of aluminum and copper, but may comprise any material with sufficient rigidness and thermal conductivity. The IC die pad 20 is illustratively rectangle-shaped, and each arm 21a-21b extends diagonally outward from a respective corner of the rectangle-shaped IC die pad. In other embodiments, the IC die pad 20 may take on other shapes.

The semiconductor device 10 illustratively includes an IC 13 mounted on the IC die pad 20. For example, the IC 13 may comprise a high powered IC, such as a processing unit. In other embodiments, more than one IC 13 could be mounted. The IC 13 illustratively includes a substrate (e.g. silicon) 27, and a plurality of bond pads (e.g. one or more of copper and aluminum) 28a-28b carried by the substrate.

The semiconductor device 10 illustratively includes a plurality of bond wires (e.g. one or more of copper, silver, gold, and aluminum) 15a-15b coupling respective ones of the plurality of bond pads 28a-28b of the IC 13 with respective ones of the plurality of electrically conductive traces 19a-19b of the circuit board 11. The semiconductor device 10 illustratively includes encapsulation material (e.g. dielectric resin) 17 surrounding the IC 13, the plurality of bond wires 15a-15b, and the plurality of arms 21a-21b.

In the illustrated embodiment, the IC die pad 20 has first and second opposing surfaces. The first opposing surface is adjacent the IC 13, and the second opposing surface is exposed through the opening 26 of the circuit board 11. Also, the IC die pad 20 and the circuit board 11 have adjacent aligned bottom surfaces 25a-25b. In other words, the IC die pad 20 and the circuit board 11 have coplanar bottom surfaces 25a-25b, thereby providing an advantageous low profile. In other embodiments, the IC die pad 20 and the circuit board 11 may have bottom surfaces 25a-25b that are vertically offset.

Additionally, the semiconductor device 10 illustratively includes an adhesive layer (e.g. a non-conductive adhesive) 16a-16b between respective distal ends of the plurality of arms 21a-21b and the circuit board 11. The encapsulation material 17 illustratively surrounds peripheral edges 24a-24c of the circuit board 11, the adhesive layer 16a-16b, and the frame 12, thereby providing advantageous mechanical protection to these peripheral edges. In other embodiments, the encapsulation material 17 may alternatively stop at the peripheral edges 24a-24c of the circuit board 11, the adhesive layer 16a-16b, and the frame 12. The semiconductor device 10 illustratively includes an adhesive layer (e.g. a non-conductive adhesive) 14 between the IC 13 and the IC die pad 20.

In the illustrated embodiment, the plurality of arms 21a-21b extends laterally and in parallel to opposing major surfaces of the circuit board 11. In other embodiments, the plurality of arms 21a-21b may extend at an angle to the opposing majors surfaces of the circuit board 11. Also, the plurality of arms 21a-21b is vertically spaced from the adjacent surface of the circuit board 11. This vertical spacing in combination with the non-conductive adhesive layer 16a-16b electrically isolates the frame 12 from the electrically active components, i.e. the frame is a non-active component. Also, in these embodiments, the plurality of electrically conductive traces 19a-19b may extend and cross under the plurality of arms 21a-21b to provide dense fan out arrangements. In other embodiments though, the plurality of arms 21a-21b extend directly along the surface of the circuit board 11, limiting the fan out pattern of the plurality of electrically conductive traces 19a-19b. Also, in other embodiments, the frame 12 may be electrically active and could serve as a ground, for example.

Advantageously, the semiconductor device 10 may provide an approach to some problems in the prior art. In prior art approaches that use organic laminate circuit boards, the carrier strip could warp during manufacturing. Moreover, the finished packaged device was also subject to warping if exposed to excess heat. Also, the thermal dissipation performance of the final device was less than satisfactory. On the other hand, in prior art approaches that used lead frames to provide connections, the density of fan out designs for contacts was not sufficient. In other words, lead frame approaches fail to provide enough input-output contacts in some applications.

The semiconductor device 10 provides an approach to these issues of the prior art. In particular, the semiconductor device 10 leverages the rigidity and thermal dissipation performance of lead frame approaches with the fan out density of circuit board approaches. Since the IC 13 is packaged with contacts in the circuit board 11, the plurality of electrically conductive traces 19a-19b are routed easily to provide a great number of input-output contacts.

Moreover, the semiconductor device 10 includes the frame 12, which effectively transfers thermal energy externally via the exposed large surface of the IC die pad 20, i.e. serving as a heat sink of sorts. Indeed, since the IC 13 sits on this heat sink, the heat dissipation performance is quite good. Also, the frame 12 maintains stiffness throughout the package during manufacture and application use without using stiffeners of prior art approaches.

Another aspect is directed to a method for making a semiconductor device 10. The method includes forming a circuit board 11 having an opening 26 therein. The method also includes positioning a frame 12 comprising an IC die pad 20 in the opening 26, and a plurality of arms 21a-21b extending outwardly from the IC die pad and coupled to the circuit board 11. The method comprises positioning at least one IC 13 on the IC die pad 20, forming a plurality of bond wires 15a-15b coupling the circuit board 11 with the at least one IC, and forming encapsulation material 17 surrounding the at least one IC, the plurality of bond wires, and the plurality of arms 21a-21b.

Referring now additionally to FIGS. 2A-2H and 3, the method for making the semiconductor device 10 is now described in greater detail. In the following figures, although two semiconductor devices 10a-10b are manufactured simultaneously, it should be appreciated that any number of semiconductor devices 10 could be manufactured in parallel (e.g. several hundred at one time).

Figure 2A:
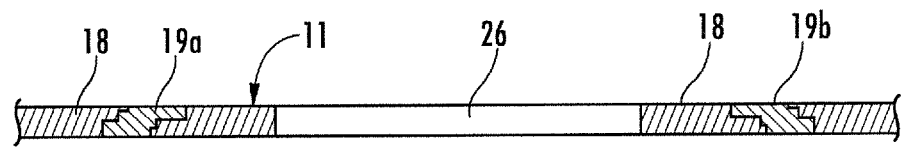
FIGS. 2A-2H are schematic side views of steps in a method for making the semiconductor device of FIG. 1.
Figure 2B:
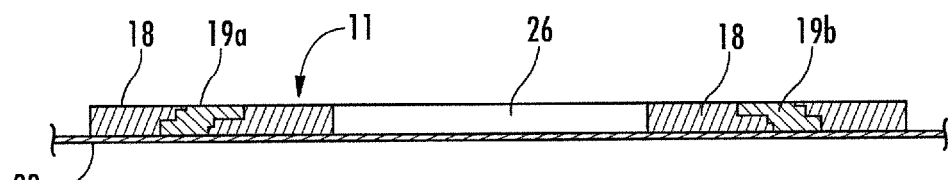
Figure 2C:
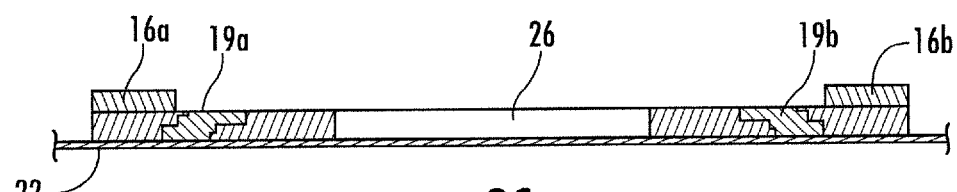

In FIGS. 2A-2B, the circuit board 11 is mounted onto an adhesive carrier layer 22. In FIG. 2C, the adhesive layer 16a-16b is formed on the circuit board 11 for receiving the frame 12.

Figure 2D:
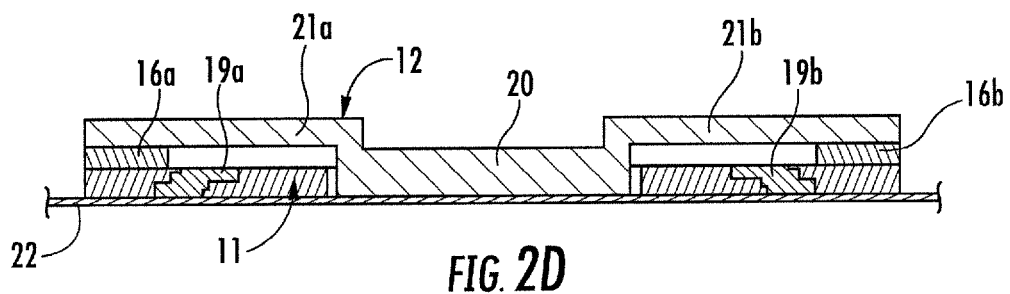
Figure 3:
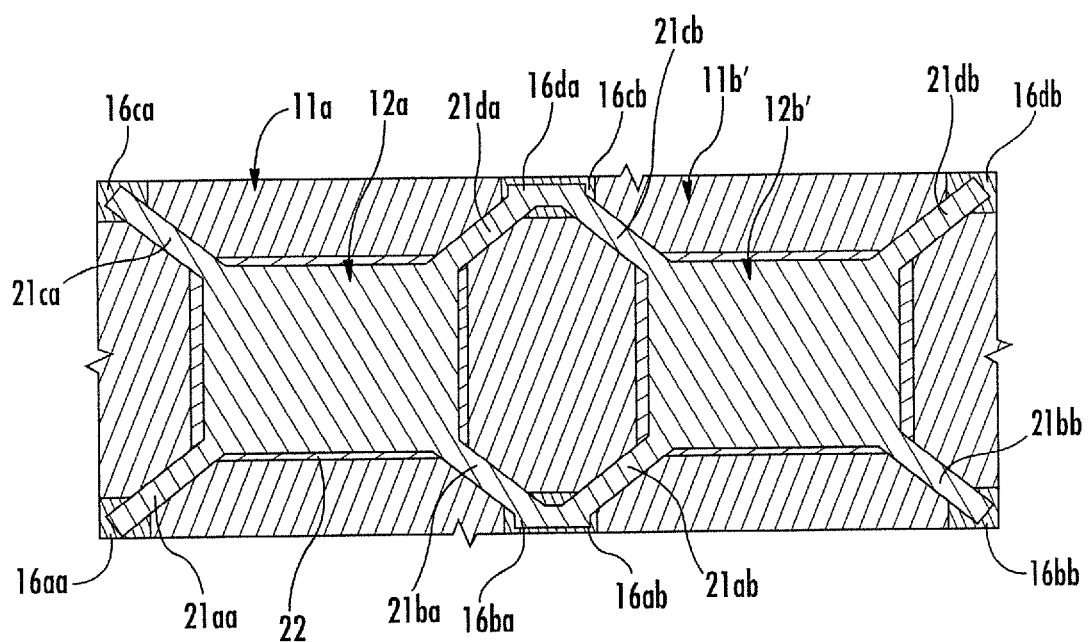
FIG. 3 is a schematic top plan view of the step from FIG. 2D.

In FIGS. 2D and 3, the frame 12 is mounted onto the circuit board. Each frame 12a-12b illustratively includes four arms 21aa-21db, but could comprise more or less arms in other embodiments. For example, in some embodiments, the frame 12a-12b may comprise six arms to provide even greater rigidity and thermal dissipation. Each arm 21aa-21db is illustratively rectangle-shaped, but may have a tapered shape (i.e. a triangle or trapezoid shaped arm) in other embodiments, i.e. the width thinning as the arm extends away from the IC die pad 20.

Figure 2E:
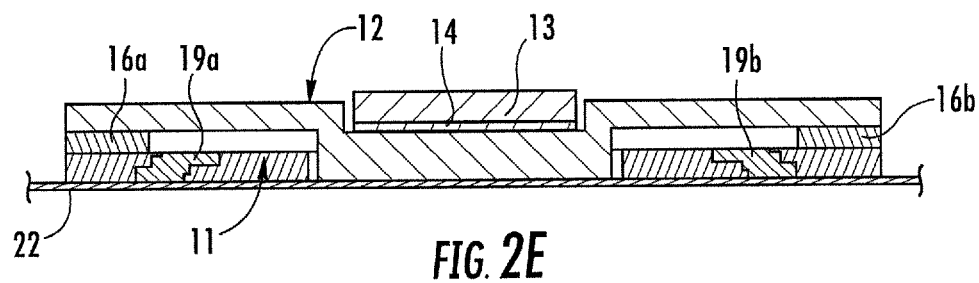
Figure 2F:
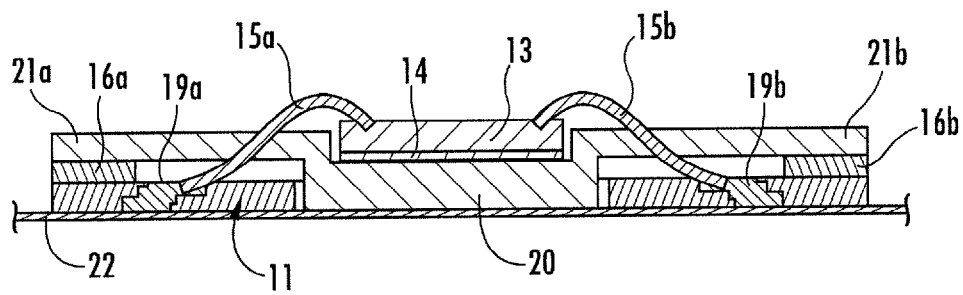

In FIG. 2E, the adhesive layer 14 is formed on the IC die pad 20, and the IC 13 is mounted onto the IC die pad. In FIG. 2F, the plurality of bond wires 15a-15b are formed between the plurality of electrically conductive traces 19a-19b and the plurality of bond pads 28a-28b of the IC 13.

Figure 2G:
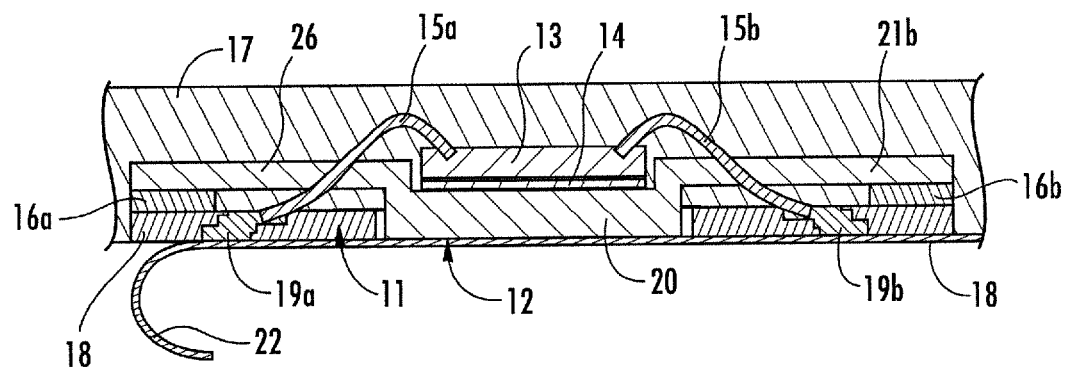
Figure 2H:
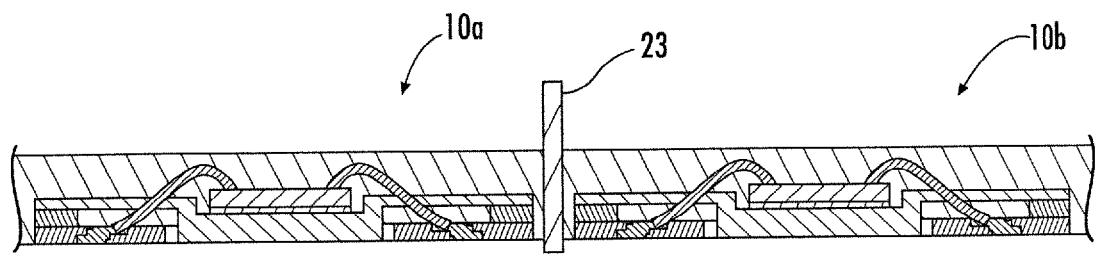

In FIG. 2G, the encapsulation material 17 is formed over the circuit board 11 and IC 13. Once encapsulation is complete, the adhesive carrier layer 22 is removed. In FIG. 2H, the carrier strip of the semiconductor devices 10a-10b is singulated with a dicing blade 23.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

What is claimed is:

1. A method for manufacturing a semiconductor device, the method comprising:
    forming an opening in a substrate, the substrate comprising a dielectric layer and a plurality of electrically conductive traces disposed within the dielectric layer;
    positioning an integrated circuit (IC) die pad of a frame in the opening, wherein the frame further comprises a plurality of arms extending outwardly from the IC die pad, each arm of the plurality of arms being devoid of a contact pad and being disposed over a first major surface of the substrate, wherein each arm of the plurality of arms directly overlaps with and extends beyond one of the plurality of electrically conductive traces disposed within the dielectric layer of the substrate in a direction away from the IC die pad and parallel to the first major surface of the substrate;
    positioning an IC on the IC die pad;
    electrically coupling the substrate with the IC through a plurality of bonding elements; and
    forming encapsulation material surrounding the IC, the plurality of bonding elements, and the plurality of arms.

2. The method of claim 1, wherein the plurality of bonding elements comprises a plurality of bond wires.

3. The method of claim 1, further comprising forming an adhesive layer over the first major surface of the substrate at a distal end of the substrate, the adhesive layer securing a distal end of an arm of the plurality of arms to the substrate.

4. The method of claim 1, wherein the IC die pad comprises a first opposing surface and a second opposing surface, wherein positioning the IC on the IC die pad comprises positioning the IC adjacent to the first opposing surface of the IC die pad, and wherein the second opposing surface of the IC die pad is exposed through the opening of the substrate.

5. The method of claim 4, wherein the substrate comprises a second major surface opposite the first major surface, and wherein the second opposing surface of the IC die pad and the second major surface of the substrate are co-planar.

6. The method of claim 1, wherein each arm of the plurality of arms extends diagonally outward from a respective corner of the IC die pad.

7. The method of claim 1, wherein the substrate comprises a multi-layer substrate, the multi-layer substrate comprising the dielectric layer and the plurality of electrically conductive traces disposed in the dielectric layer.

8. The method of claim 7, wherein electrically coupling the substrate with the IC through a plurality of bonding elements comprises electrically coupling the IC with the plurality of electrically conductive traces through the plurality of bonding elements.

9. A method of manufacturing a semiconductor device, the method comprising:
    forming an opening through a thickness of a substrate;
    mounting the substrate having the opening onto a carrier layer;
    forming an adhesive layer on a first major surface of the substrate at distal ends of the substrate, the first major surface of the substrate being directed away from the carrier layer;
    mounting a frame onto the carrier layer and the substrate, the frame comprising an integrated circuit (IC) die pad disposed in the opening, the frame further comprising a central portion and a plurality of arms extending outwardly from the IC die pad and the central portion, wherein distal ends of the plurality of arms are adhered to the distal ends of the substrate via the adhesive layer, wherein the distal ends of the substrate comprises peripheral edges of the substrate, and wherein the frame is devoid of contact pads, and wherein each arm of the plurality of arms extends diagonally outward from a respective corner of the central portion;
    positioning an IC die on the IC die pad;
    electrically coupling the IC die to electrical traces carried by the substrate via a plurality of bonding elements without the frame being an intermediary coupling element, wherein each arm of the plurality of arms directly overlaps with and extends beyond one of the electrical traces in a direction away from the IC die pad and parallel to the first major surface of the substrate; and
    encapsulating the IC die, the plurality of bonding elements, and the plurality of arms in an encapsulant.

10. The method of claim 9, wherein each arm of the plurality of arms comprises a proximal end extending over the first major surface of the substrate, each arm being spaced apart from the first major surface of the substrate.

11. The method of claim 10, wherein encapsulating the IC die, the plurality of bonding elements, and the plurality of arms in the encapsulant comprises forming the encapsulant between the proximal end of each arm of the plurality of arms and the first major surface of the substrate.

12. The method of claim 9, wherein encapsulating the IC die, the plurality of bonding elements, and the plurality of arms in the encapsulant comprises encapsulating the peripheral edges of the substrate and the frame in the encapsulant.

13. The method of claim 9, wherein the plurality of bonding elements comprises bonding wires.

14. The method of claim 9, wherein the IC die pad comprises a rectangle-shaped IC die pad, and wherein each arm of the plurality of arms extends diagonally outwardly from a respective corner of the rectangle-shaped IC die pad.

15. The method of claim 9, further comprising removing the carrier layer after encapsulating the IC die, the plurality of bonding elements, and the plurality of arms in the encapsulant.

16. A method for manufacturing a semiconductor device, the method comprising:
    providing a circuit board comprising a first major surface, a second major surface opposite the first major surface, an opening extending between the first and the second major surfaces, a first conductive trace and a second conductive trace, the first and the second conductive traces being exposed at the first major surface of the circuit board;
    attaching a frame to the circuit board over the second major surface, wherein the frame comprises a central portion and a plurality of arms extending away from the central portion, wherein each arm of the plurality of arms and extends diagonally outward from a respective corner of the central portion, and wherein the central portion and the plurality of arms are devoid of a contact pad;

attaching an integrated circuit (IC) to the central portion of the frame;

attaching a first bond wire from the IC to the first conductive trace and a second bond wire from the IC to the second conductive trace; and forming encapsulation material surrounding the IC, the first and the second bond wires, and the plurality of arms; and dicing the circuit board to form a semiconductor device, wherein the plurality of arms is embedded within the semiconductor device between the encapsulation material and the circuit board.

17. The method of claim 16, further comprising forming an adhesive layer over the second major surface of a substrate at a distal end of the circuit board, the adhesive layer securing a distal end of an arm of the plurality of arms to the circuit board.

18. The method of claim 16, wherein attaching the IC comprises forming an non-conductive adhesive layer to the central portion and attaching the IC to the non-conductive adhesive layer.

19. The method of claim 16, wherein the plurality of arms directly overlapping the first conductive trace and the second conductive trace and extending further beyond the first conductive trace and the second conductive trace in a direction away from the central portion.

* * * * *